(12) United States Patent
Wells

(10) Patent No.: US 8,283,198 B2
(45) Date of Patent: Oct. 9, 2012

(54) RESISTIVE MEMORY AND METHODS OF PROCESSING RESISTIVE MEMORY

(75) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 290 days.

(21) Appl. No.: 12/776,764

(22) Filed: May 10, 2010

(65) Prior Publication Data

US 2011/0272660 A1 Nov. 10, 2011

(51) Int. Cl.
*H01L 21/00* (2006.01)
*H01L 29/08* (2006.01)

(52) U.S. Cl. ............ 438/95; 438/84; 438/102; 438/382; 438/384; 257/4; 257/5; 257/E21.014; 257/E21.209; 257/E21.215

(58) Field of Classification Search .................. 257/4, 5, 257/E21.014, E21.209, E21.215; 438/84, 438/95, 382, 102, 384
See application file for complete search history.

(56) References Cited

U.S. PATENT DOCUMENTS

| | | | |
|---|---|---|---|
| 6,825,489 B2 * | 11/2004 | Kozicki ........................ 257/42 |
| 7,372,092 B2 | 5/2008 | Manning et al. |
| 7,504,298 B2 | 3/2009 | Manning et al. |
| 7,572,572 B2 | 8/2009 | Wells |
| 7,785,920 B2 * | 8/2010 | Lung et al. ...................... 438/95 |
| 2006/0071204 A1 * | 4/2006 | Happ ................................. 257/3 |
| 2007/0096162 A1 * | 5/2007 | Happ et al. ..................... 257/246 |
| 2007/0173019 A1 * | 7/2007 | Ho et al. ........................ 438/257 |
| 2007/0232015 A1 | 10/2007 | Liu |
| 2008/0191187 A1 | 8/2008 | Lung et al. |
| 2009/0027938 A1 | 1/2009 | Wells |
| 2009/0101883 A1 | 4/2009 | Lai et al. |
| 2009/0173982 A1 | 7/2009 | Manning et al. |
| 2009/0194756 A1 | 8/2009 | Kau et al. |
| 2009/0194758 A1 | 8/2009 | Chen |
| 2009/0220744 A1 | 9/2009 | Martinez, Jr. et al. |
| 2009/0271758 A1 | 10/2009 | Wells |
| 2010/0003782 A1 * | 1/2010 | Sinha et al. ................... 438/104 |

* cited by examiner

*Primary Examiner* — Long Tran (74) *Attorney, Agent, or Firm* — Brooks, Cameron & Huebsch, PLLC (57) ABSTRACT

Resistive memory and methods of processing resistive memory are described herein. One or more method embodiments of processing resistive memory include forming a resistive memory cell material on an electrode having an access device contact, and forming a heater electrode on the resistive memory cell material after forming the resistive memory cell material on the electrode such that the heater electrode is self-aligned to the resistive memory cell material.

10 Claims, 9 Drawing Sheets

RESISTIVE MEMORY AND METHODS OF PROCESSING RESISTIVE MEMORY

TECHNICAL FIELD

The present disclosure relates generally to semiconductor memory devices, methods, and systems, and more particularly, to resistive memory and methods of processing resistive memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, resistive random access memory (RRAM), and phase change random access memory (PCRAM), among others.

Memory devices such as resistive memory devices may be utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices such as resistive memory devices may include a number of memory cells, e.g., resistive memory cells, arranged in a matrix, e.g., array. For example, an access device, such as a diode, a field effect transistor (FET), or bipolar junction transistor (BJT), of the memory cells may be coupled to an access line, e.g., word line, forming a "row" of the array. The memory elements of each memory cell may be coupled to a data line, e.g., bit line, in a "column" of the array. In this manner, the access device of a memory cell may be accessed through a row decoder activating a row of memory cells by selecting the word line coupled to their gates. The programmed state of a row of selected memory cells may be determined, e.g., sensed, by causing different currents, to flow in the memory elements depending on the resistance associated with a programmed state for a particular memory cell.

Memory cells such as resistive memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Resistive memory cells such as PCRAM cells may store data by varying the resistance level of a resistive memory cell material, e.g., resistive memory element. The resistive memory element of a PCRAM cell may be a phase change material, such as Germanium-Antimony-Telluride (GST). The phase change material may exist in an amorphous, higher resistance state, or a crystalline, lower resistance state. The resistance state of the PCRAM cell may be altered by applying sources of energy to the cell, such as current pulses or pulses of light, among other sources of energy. For example, applying a programming current to a heater electrode adjacent the phase change material may heat the heater electrode, which in turn may heat the adjacent phase change material and alter the resistance state of the cell. This may result in the PCRAM cell being programmed to a particular resistance state, which may correspond to a data state. In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1.

Methods for processing, e.g., fabricating, PCRAM cells may include forming the heater electrode of the cell before forming the phase change material of the cell, e.g., first forming the heater electrode, and then subsequently forming the phase change material on top of the heater electrode. That is, PCRAM cells may have the heater electrode below the phase change material, e.g., the heater electrode may be the bottom electrode of the cell.

DETAILED DESCRIPTION

Resistive memory and methods of processing resistive memory are described herein. One or more method embodiments of processing resistive memory include forming a resistive memory cell material on an electrode having an access device contact, and forming a heater electrode on the resistive memory cell material after forming the resistive memory cell material on the electrode such that the heater electrode is self-aligned to the resistive memory cell material.

Processing resistive memory, e.g., resistive memory cells or resistive memory devices, in accordance with embodiments of the present disclosure can increase the efficiency and decrease the cost of processing, e.g., manufacturing, resistive memory. Further, processing resistive memory in accordance with embodiments of the present disclosure can decrease the size of resistive memory, and can also increase the speed of resistive memory, e.g., the rate at which resistive memory can program and/or sense data. Processing resistive memory in accordance with embodiments of the present disclosure can also increase the amount of data that can be stored by resistive memory. Additionally, processing resistive memory in accordance with embodiments of the present disclosure can increase the consistency and reliability of resistive memory. For example, processing resistive memory in accordance with embodiments of the present disclosure can decrease the number of erroneous data reads associated with resistive memory.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense. As used herein, "a number of" something can refer to one or more such things. For example, a number of memory devices can refer to one or more memory devices.

Figure 1A:
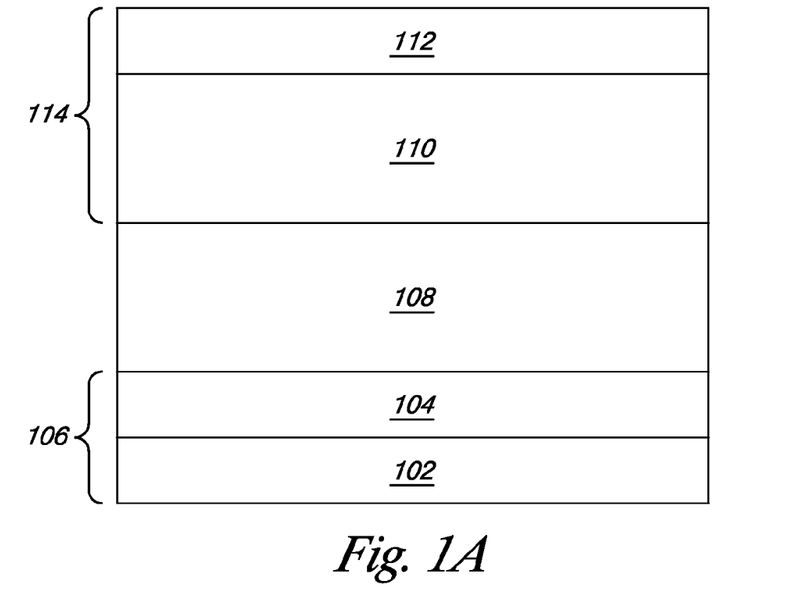
FIGS. 1A-1F illustrate process steps associated with forming a resistive memory cell in accordance with embodiments of the present disclosure.

FIGS. 1A-1F illustrate process steps associated with forming a resistive memory cell in accordance with embodiments of the present disclosure. FIG. 1A illustrates a schematic cross-sectional view of a resistive memory cell material 108 formed, e.g., deposited, between a bottom electrode 106 and a top electrode 114. Top electrode 114 can be formed on top of resistive memory cell material 108 after resistive memory cell material 108 is formed on top of bottom electrode 106.

As shown in FIG. 1A, bottom electrode 106 can include an access device contact 102 and a metal 104. Metal 104 can be, for example, tungsten, among other metals. Access device contact 102 can be directly connected to an access device (not shown in FIG. 1A), such as a diode, a field effect transistor (FET), or bipolar junction transistor (BJT), among others.

As used herein, a "bottom electrode" can refer to an electrode that is directly connected to an access device, e.g., by an access device contact. As used herein, a "top electrode" can refer to an electrode that is not directly connected to an access device, e.g., an electrode that does not include an access device contact. A "bottom electrode" can also refer to the first electrode formed during processing of a memory cell, and a "top electrode" can also refer to the second electrode formed during processing of a memory cell.

When an element is referred to as being "directly connected" to another element, there are no intervening elements present between the two elements, other than any native oxide that may form after deposition of one element but before deposition of the other element. For example, a "bottom electrode" as used herein may have no intervening elements present between the bottom electrode and an access device, other than any native oxide that may form after deposition of the bottom electrode but before deposition of the access device. In contrast, a "top electrode" as used herein may have intervening elements, e.g. a resistive memory cell material and bottom electrode, between the top electrode and an access device.

Resistive memory cell material 108 can be, for example, a phase change (PC) material. PC materials can include, for example, phase change chalcogenide alloys such as Germanium-Antimony-Tellurium (GST) materials, e.g., Ge—Sb—Te materials such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other PC materials can include, for example, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other PC materials. However, embodiments of the present disclosure are not limited to a particular type of PC material.

Top electrode 114 and/or bottom electrode 106 can be heater electrodes. For example, top electrode 114 can be a heater electrode. Top, e.g., heater, electrode 114 can include a conductor 110 and an element 112, as shown in FIG. 1A. Conductor 110 can be, for example, titanium nitride (TiN) or tungsten. Element 112 can be, for example, a metal, such as tungsten or platinum. The metal can be, for example, a low-resistance metal. Alternatively, element 112 can be a dielectric, such as silicon nitride ($Si_3N_4$). The dielectric can have etch resistance for subsequent etches. Embodiments of the present disclosure, however, are not limited to a particular type of top, e.g., heater, electrode. Element 112 can have a thickness equal to a distance from the bottom of element 112 to the top of element 112, e.g., approximately 200 Angstroms.

A heater electrode can be a material used to heat resistive memory cell material 108 during a programming operation. For example, during a programming operation, a current, e.g., a programming current, can pass from bottom electrode 106 to top, e.g., heater, electrode 114 through resistive memory cell material 108. This current can heat top, e.g., heater, electrode 114. The heated top, e.g., heater, electrode 114 can, in turn, heat resistive memory cell material 108, which can alter the resistance state of resistive memory cell material 108. This can result in resistive memory cell material 108 being programmed to a particular resistance state, which can correspond to a particular data state.

In embodiments of the present disclosure, metal 104, resistive memory cell material 108, and top electrode 114 can be formed in situ. That is, metal 104, resistive memory cell material 108, and top electrode 114 can be formed in a sealed environment, e.g., chamber. For example, metal 104 can be formed in a sealed environment. Resistive memory cell material 108 can then be formed on top of metal 104, e.g., on top of bottom-electrode 106, in the same sealed environment without breaking the seal, e.g., vacuum of the environment. Top electrode 114 can then be formed on top of resistive memory cell material 108 in the same sealed environment without breaking the seal of the environment. In contrast, in previous approaches in which a resistive memory cell material is formed on top of a heater electrode, e.g., in which the heater electrode is the bottom electrode, the resistive memory cell material may not be formed in situ.

Figure 1B:
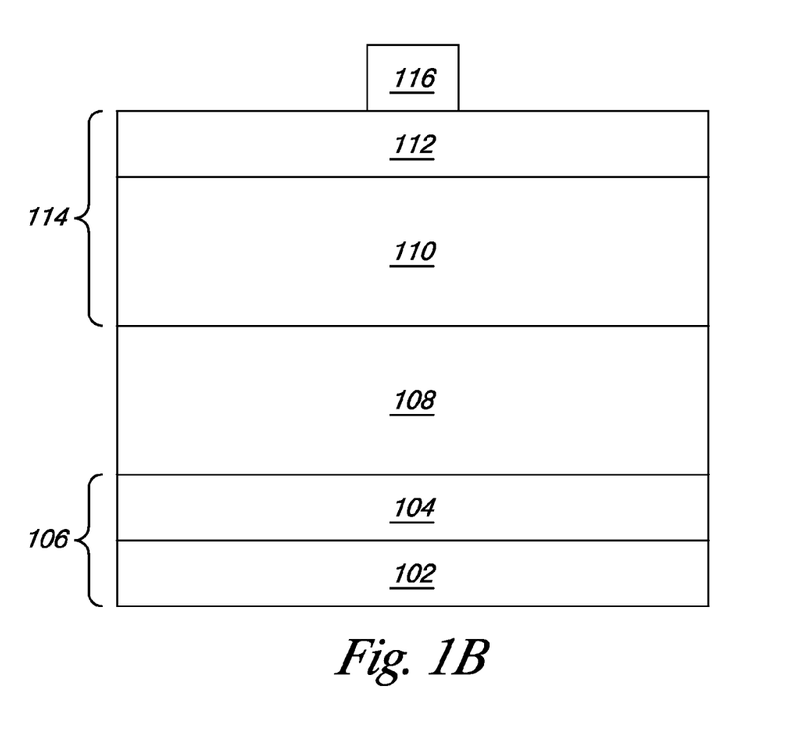

FIG. 1B illustrates a schematic cross-sectional view of the structure shown in FIG. 1A after a subsequent processing step. In FIG. 1B a photoresist 116 may be formed on top electrode 114.

Photoresist 116 can be formed on top electrode 114 by depositing a photoresist on top electrode 114, and then removing, e.g., etching and/or patterning, a portion of the photoresist using a number of photolithographic techniques, as will be appreciated by one of skill in the art. As shown in FIG. 1B, the portion of the photoresist can be removed such that photoresist 116 remains over a portion of top electrode 114, e.g., such that photoresist 116 does not remain over the entire top electrode 114. Photoresist 116 can serve as a mask during a number of subsequent processing steps, as will be further described herein.

Figure 1C:
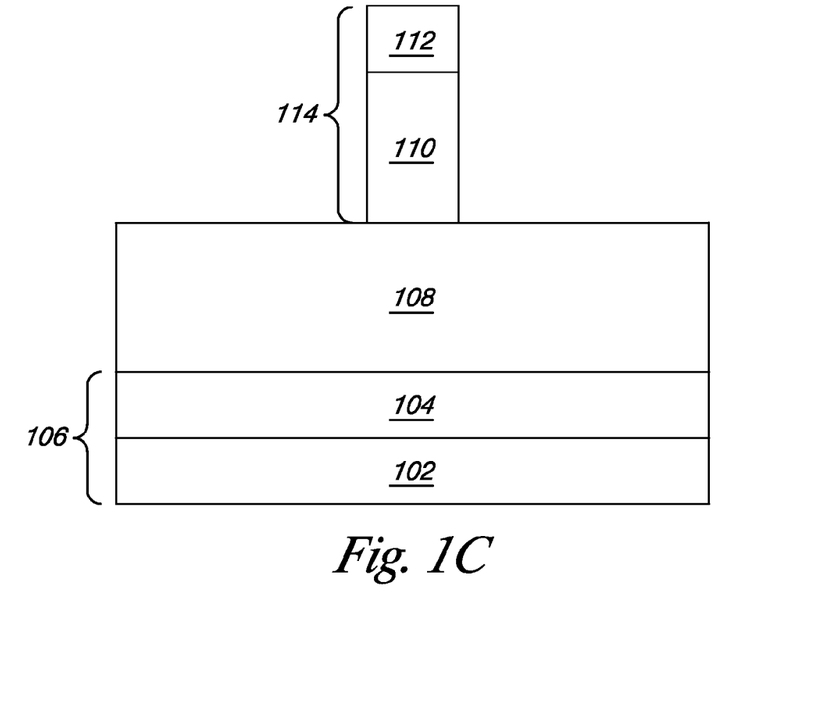

FIG. 1C illustrates a schematic cross-sectional view of the structure shown in FIG. 1B after a subsequent processing step. Photoresist 116 and a portion of top electrode 114 are removed. The removed portion of top electrode 114 can be the portion of top electrode 114 not protected by photoresist 116.

Photoresist 116 and the removed portion of top electrode 114 can be removed in a number of ways. For example, the removed portion of top electrode 114 can be removed with a dry etch. During the dry etch, the pattern of photoresist 116 can be transferred into top electrode 114. That is, photoresist 116 can serve as a mask that protects the portion of top electrode 114 shown in FIG. 1C, e.g., that prevents the portion of top electrode 114 shown in FIG. 1C from being removed, during the dry etch. Photoresist 116 can then be stripped after the removed portion of top electrode 114 is removed, e.g., after the dry etch is complete.

Figure 1D:
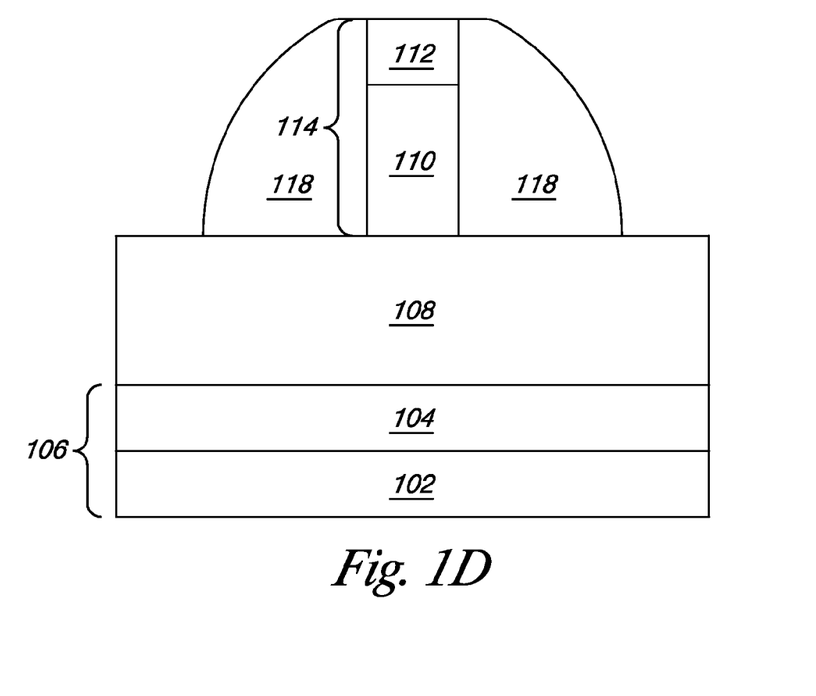

FIG. 1D illustrates a schematic cross-sectional view of the structure shown in FIG. 1C after a subsequent processing step. In FIG. 1D a spacer 118 may be formed on resistive memory cell material 108 and adjacent the sidewall of top electrode 114.

Spacer 118 can be formed by depositing a spacer material in a number of ways, including chemical vapor deposition (CVD) and/or atomic layer deposition (ALD), and then removing, e.g., etching and/or patterning, a portion of the spacer, as will be appreciated by one of skill in the art. As shown in FIG. 1D, spacer 118 can occupy a portion of the area previously occupied by the removed portion of top electrode 114.

Spacer 118 can be, for example, a dielectric spacer. Dielectric spacers can include, for example, oxide dielectric spacers, such as silicon dioxide ($SiO_2$) dielectric spacers, and nitride dielectric spacers, such as silicon nitride ($Si_3N_4$) dielectric spacers. However, embodiments of the present disclosure are not limited to a particular type of dielectric spacer.

Figure 1E:
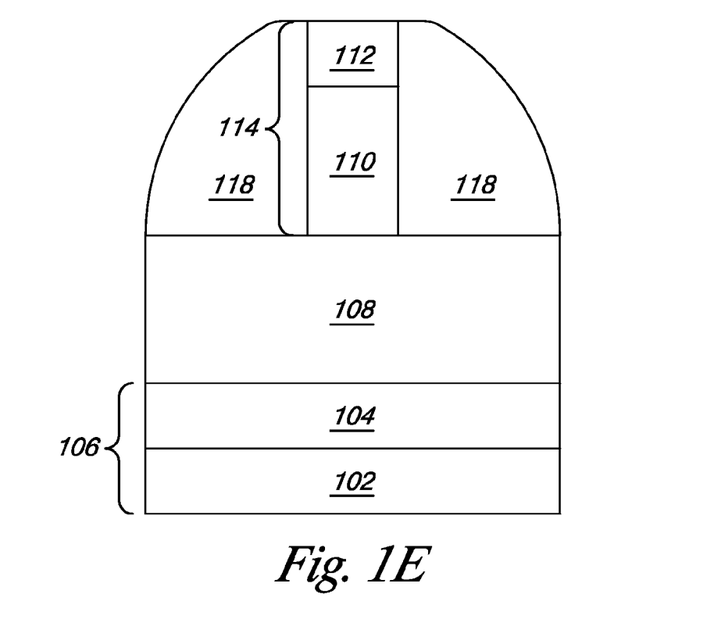

FIG. 1E illustrates a schematic cross-sectional view of the structure shown in FIG. 1D after a subsequent processing step. A portion of resistive memory cell material 108 and a portion of bottom electrode 106 are removed. As shown in FIG. 1E, the removed portions of resistive memory cell material 108 and bottom electrode 106 can be the portions of resistive memory cell material 108 and bottom electrode 106 not covered by spacer 118 or top electrode 114.

As shown in FIG. 1E, the width, e.g., diameter, of top electrode 114 can be smaller than the width, e.g., diameter, of bottom electrode 106. The widths of top electrode 114 and bottom electrode 106 can be measured, for example, at the points where top electrode 114 and bottom electrode 106 are in contact with resistive memory cell material 108. For example, the area of top electrode 114 in contact with resistive memory cell material 108 can be smaller than the area of bottom electrode 106 in contact with resistive memory cell material 108. The width of top electrode 114 can be, for example, approximately 20 nanometers, among other widths.

The removed portions of resistive memory cell material 108 and bottom electrode 106 can be removed, e.g., etched and/or patterned, in a number of ways, as will be appreciated by one of skill in the art. For example, the removed portions of resistive memory cell material 108 and bottom electrode 106 can be removed during a single etch. Alternatively, the removed portion of resistive memory cell material 108 can be removed in a first etch, and the removed portion of bottom electrode 106 can be removed in a second, subsequent etch.

As shown in FIG. 1E, top electrode 114 can be self-aligned to resistive memory cell material 108 and spacer 118. That is, a surface, e.g., the bottom, of top electrode 114 can be confined to a surface of resistive memory cell material 108, and a surface, e.g., the sidewall, of top electrode 114 can be confined to a surface of spacer 118. Self-alignment of top electrode 114 can be achieved without forming, e.g., depositing, resistive memory cell material 108 conformally. For example, self-alignment of top electrode 114 can be achieved by forming resistive memory cell material 108 using sputter deposition techniques, such as laser sputtering and reactive sputtering, among other deposition techniques.

Figure 1F:
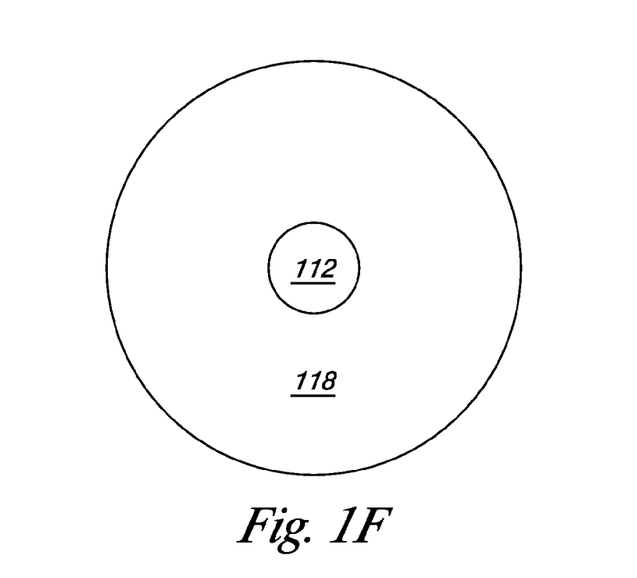

FIG. 1F illustrates a schematic top view of the embodiment shown in FIG. 1E. As shown in FIG. 1F, spacer 118 surrounds top electrode 114, e.g., conductor 110 and element 112.

Figure 2A:
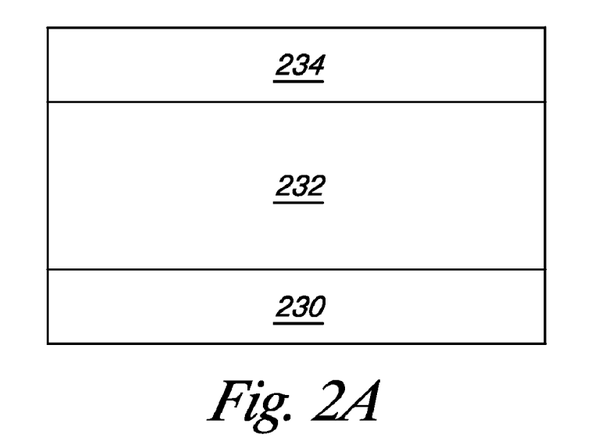
FIGS. 2A-2I illustrate process steps associated with forming a resistive memory cell in accordance with embodiments of the present disclosure.

FIGS. 2A-2I illustrate process steps associated with forming a resistive memory cell in accordance with embodiments of the present disclosure. FIG. 2A illustrates a schematic cross-sectional view of a resistive memory cell material 232 formed, e.g., deposited, on top of a bottom electrode 230, and a top electrode 234 formed on top of resistive memory cell material 232. Top electrode 234 can be formed on top of resistive memory cell material 232 after resistive memory cell material 232 is formed on top of bottom electrode 230.

In a number of embodiments, a tunneling dielectric (not shown) can be formed on resistive memory cell material 232 before top electrode 234 is formed. That is, a tunneling dielectric can be located between resistive memory cell material 232 and top electrode 234. The tunneling dielectric can be, for example, a titanium dioxide ($TiO_2$) tunneling dielectric. However, embodiments of the present disclosure are not limited to a particular type of tunneling dielectric.

Although not shown in FIG. 2A, bottom electrode 230 can include an access device contact and a metal in a manner analogous to bottom electrode 106 previously described herein. Bottom electrode 230 can be directly connected to an access device (not shown in FIG. 2A), such as a diode, a field effect transistor (FET), or a bipolar junction transistor (BJT), among others.

Resistive memory cell material 232 can be, for example, a PC material, such as the PC materials previously described herein. Top electrode 234 can be a heater electrode. Although not shown in FIG. 2A, top, e.g., heater, electrode 234 can include a conductor and either a metal or dielectric in a manner analogous to top electrode 114 previously described herein. However, embodiments of the present disclosure are not limited to a particular type of top, e.g., heater, electrode. A heater electrode can be a material used to heat resistive memory cell material 232 during a programming operation, as previously described herein.

In a number of embodiments, resistive memory cell material 232 and top electrode 234 can be formed in situ. That is, resistive memory cell material 232 and top electrode 234 can be formed in a sealed environment, e.g., chamber. For example, resistive memory cell material 232 can be formed in a sealed environment. Top electrode 234 can then be formed on top of resistive memory cell material 232 in the same sealed environment without breaking the seal, e.g., vacuum of the environment. In contrast, in previous approaches in which a resistive memory cell material is formed on top of a heater electrode, e.g., in which the heater electrode is the bottom electrode, the resistive memory cell material may not be formed in situ.

Figure 2B:
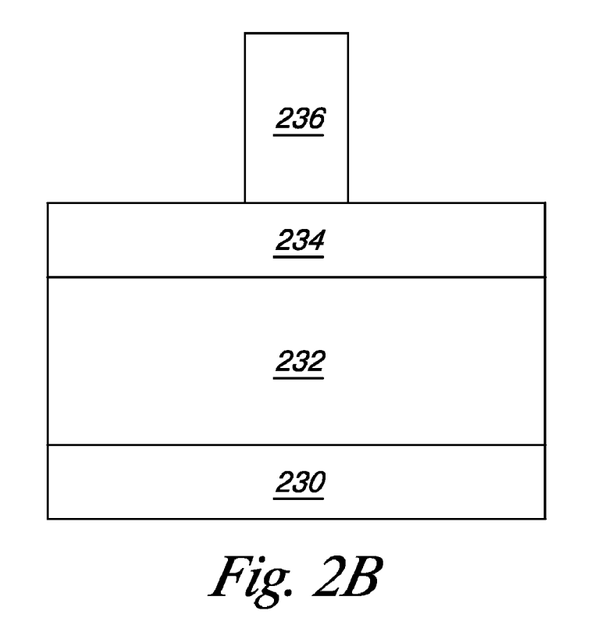

FIG. 2B illustrates a schematic cross-sectional view of the structure shown in FIG. 2A after a subsequent processing step. A plug 236 may be formed on top electrode 234. Plug 236 can be, for example, a dielectric plug or a metal plug. Dielectric plug 236 can include, for example, an oxide, such as silicon dioxide ($SiO_2$), and nitride, such as silicon nitride ($Si_3N_4$), dielectric plugs. A metal plug can include, for example, tungsten and platinum metal plugs. However, embodiments of the present disclosure are not limited to a particular type of dielectric or metal plug.

Plug 236 can be formed on top electrode 234 by forming, e.g., depositing, a plug material, e.g., a dielectric or metal material, on top electrode 234, and then removing, e.g., etching and/or patterning, a portion of the plug material, as will be understood by one of skill in the art. As shown in FIG. 2B, the portion of the plug material can be removed such that plug 236 remains over a portion of top electrode 234, e.g., such that plug 236 does not remain over the entire top electrode 234. Plug 236 can serve as a mask during a number of subsequent processing steps, as will be further described herein.

Figure 2C:
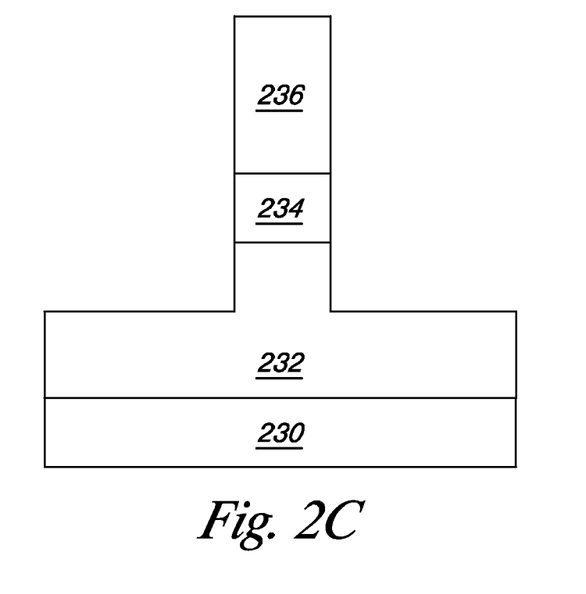

FIG. 2C illustrates a schematic cross-sectional view of the structure shown in FIG. 2B after a subsequent processing step. A portion of top electrode 234 and a portion of resistive memory cell material 232 are removed. As shown in FIG. 2C, the removed portion of top electrode 234 can be the portion of top electrode 234 not protected by plug 236. The removed portion of resistive memory cell material 232 can be a portion of the portion of resistive memory cell material 232 not protected by plug 236, as shown in FIG. 2C.

The removed portions of top electrode 234 and resistive memory cell material 232 can be removed in a number of ways known in the art. For example, the removed portions of top electrode 234 and resistive memory cell material 232 can be removed with a dry etch. During the dry etch, the pattern of plug 236 can be transferred into top electrode 234 and resistive memory cell material 232. That is, plug 236 can serve as a mask that protects the portions of top electrode 234 and resistive memory cell material 232 underneath plug 236; e.g., that prevents the portions of top electrode 234 and resistive memory cell material 232 underneath plug 236 from being removed, during the dry etch, as shown in FIG. 2C.

Figure 2D:
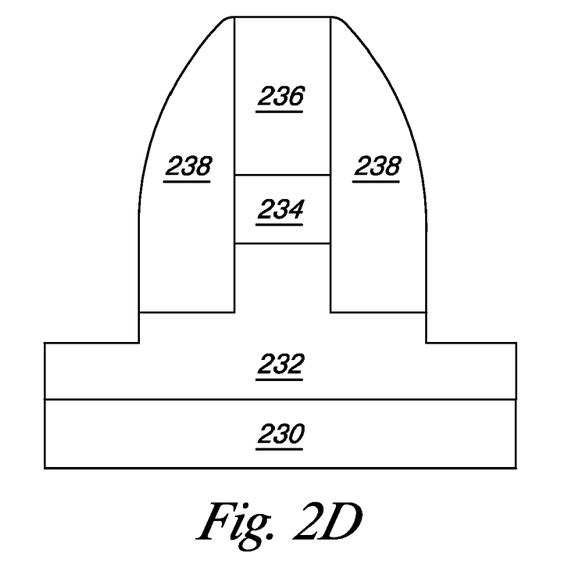

FIG. 2D illustrates a schematic cross-sectional view of the structure shown in FIG. 2C after a subsequent processing step. A first spacer 238 may be formed on resistive memory cell material 232 and adjacent the sidewalls of top electrode 234 and plug 236. First spacer 238 can be, for example, a metal spacer.

First spacer 238 can be formed by depositing a first spacer material in a number of ways, including chemical vapor deposition (CVD) and/or atomic layer deposition (ALD), and then removing, e.g., etching and/or patterning, a portion of the first spacer, as will be appreciated by one of skill in the art. As shown in FIG. 2D, first spacer 238 can occupy a portion of the area previously occupied by the removed portion of top electrode 234 the removed portion of resistive memory cell material 232.

After first spacer 238 is formed, an additional portion of resistive memory cell material 232 can be removed, e.g., etched and/or patterned, as shown in FIG. 2D. The additional removed portion of resistive memory cell material 232 can be a portion of the portion of resistive memory cell material 232 not protected by first spacer 238, as shown in FIG. 2D. That is, first spacer 238 can serve as a mask that protects the portion of resistive memory cell material 232 underneath first spacer 238, e.g., that prevents the portion of resistive memory cell material 232 underneath first spacer 238 from being removed.

Figure 2E:
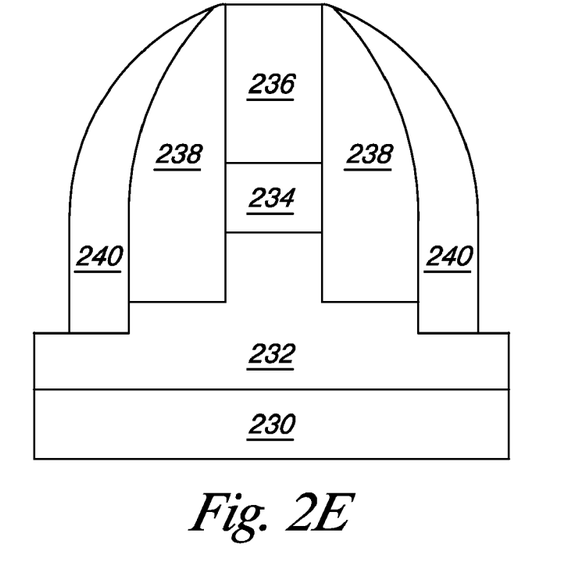

FIG. 2E illustrates a schematic cross-sectional view of the structure shown in FIG. 2D after a subsequent processing step. A second spacer 240 may be formed on resistive memory cell material 232 and adjacent the sidewall of first spacer 238.

Second spacer 240 can be, for example, a dielectric spacer. Dielectric spacers can include, for example, oxide dielectric spacers, such as silicon dioxide ($SiO_2$) dielectric spacers, and nitride dielectric spacers, such as silicon nitride ($Si_3N_4$) dielectric spacers. However, embodiments of the present disclosure are not limited to a particular type of dielectric spacer.

Second spacer 240 can be formed by depositing a second spacer material in a number of ways, including CVD and/or ALD, and then removing, e.g., etching and/or patterning, a portion of the second spacer, as will be appreciated by one of skill in the art. As shown in FIG. 2E, second spacer 240 can occupy a portion of the area previously occupied by the additional removed portion of resistive memory cell material 232.

Figure 2F:
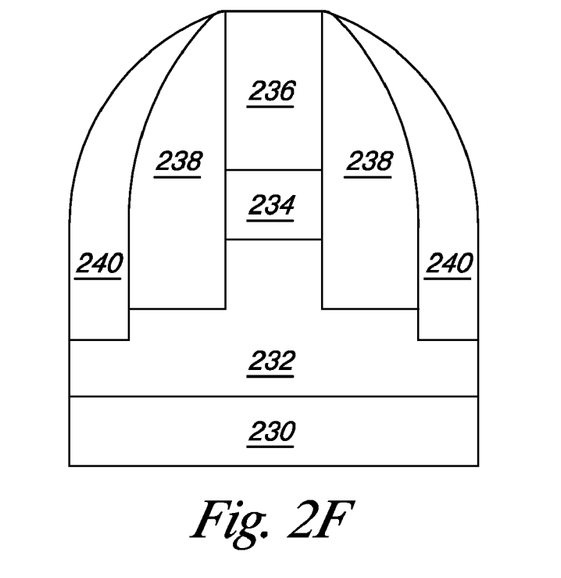

FIG. 2F illustrates a schematic cross-sectional view of the structure shown in FIG. 2E after a subsequent processing step. A second additional portion of resistive memory cell material 232 and a portion of bottom electrode 230 are removed. As shown in FIG. 2F, the removed second additional portion of resistive memory cell material 232 and the removed portion of bottom electrode 230 can be the portions of resistive memory cell material 232 and bottom electrode 230 not covered by second spacer 240, first spacer 238, or top electrode 234.

As shown in FIG. 2F, the width, e.g., diameter, of top electrode 234 can be smaller than the width, e.g., diameter, of bottom electrode 230. The widths of top electrode 234 and bottom electrode 230 can be measured, for example, at the points where top electrode 234 and bottom electrode 230 are in contact with resistive memory cell material 232. For example, the area of top electrode 234 in contact with resistive memory cell material 232 is smaller than the area of bottom electrode 230 in contact with resistive memory cell material 232. The width of top electrode 234 can be, for example, approximately 100 Angstroms, among other widths.

The second additional removed portion of resistive memory cell material 232 and the removed portion of bottom electrode 230 can be removed, e.g., etched and/or patterned, in a number of ways, as will be appreciated by one of skill in the art. For example, the second additional removed portion of resistive memory cell material 232 and the removed portion of bottom electrode 230 can be removed during a single etch. Alternatively, the second additional removed portion of resistive memory cell material 232 can be removed in a first etch, and the removed portion of bottom electrode 230 can be removed in a second, subsequent etch.

As shown in FIG. 2F, top electrode 234 can be self-aligned to resistive memory cell material 232 and first spacer 238. That is, a surface, e.g., the bottom, of top electrode 234 can be confined to a surface of resistive memory cell material 232, and a surface, e.g., the sidewall, of top electrode 234 can be confined to a surface of first spacer 238. Self-alignment of top electrode 234 can be achieved without forming, e.g., depositing, resistive memory cell material 232 conformally. For example, self-alignment of top electrode 234 can be achieved by forming resistive memory cell material 232 using sputter deposition techniques, such as laser sputtering and reactive sputtering, among other deposition techniques.

Figure 2G:
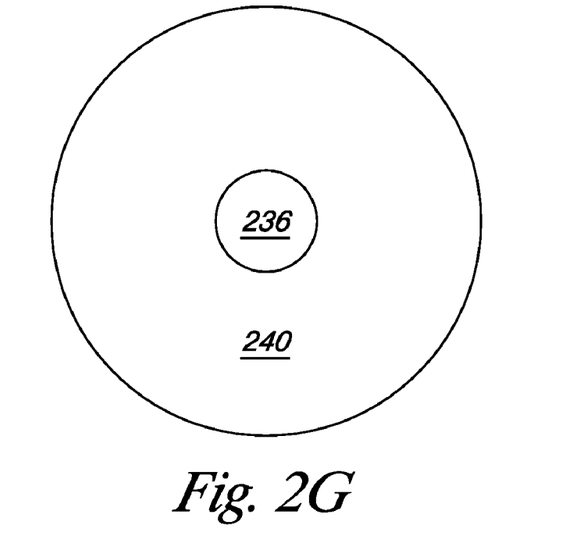

FIG. 2G illustrates a schematic top view of the embodiment shown in FIG. 2F. As shown in FIG. 2G, second spacer 240 surrounds top electrode 236.

Figure 2H:
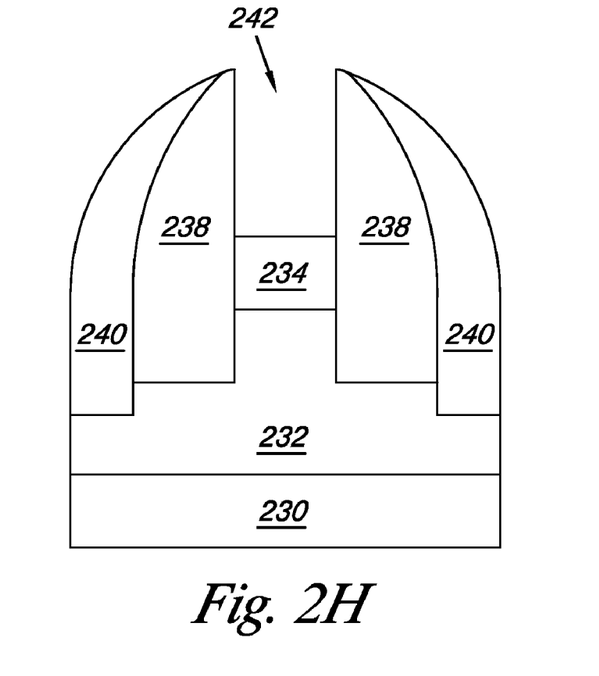

FIG. 2H illustrates a schematic cross-sectional view of the structure shown in FIG. 2F after a subsequent processing step for embodiments in which plug 236 is a metal plug. That is, the processing steps described in connection with FIGS. 2H and 2I may be omitted for embodiments in which plug 236 is a dielectric plug.

In the embodiment illustrated in FIG. 2H, metal plug 236 is removed to form opening 242. Metal plug 236 can be removed, e.g., etched and/or patterned, in a number of ways, as will be appreciated by one of skill in the art.

Figure 2I:
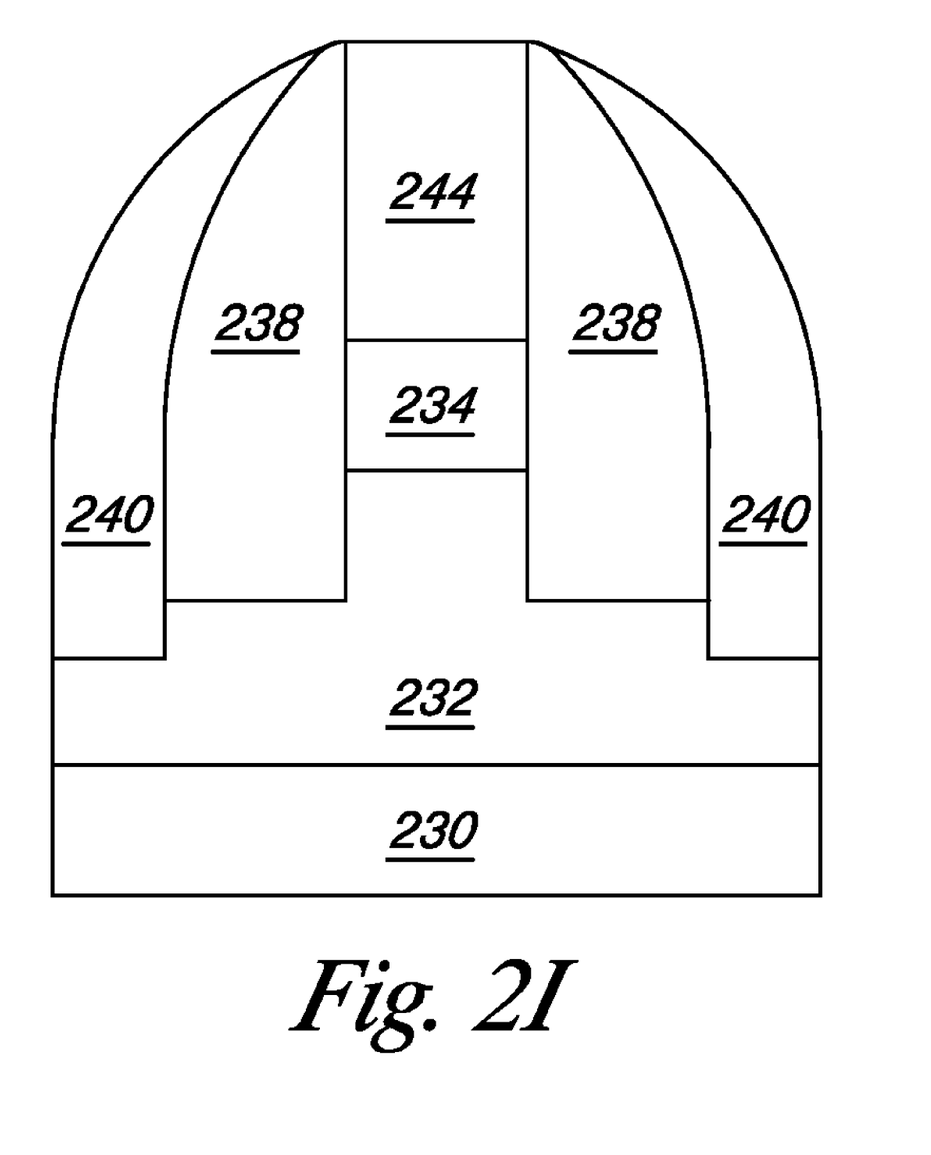

FIG. 2I illustrates a schematic cross-sectional view of the structure shown in FIG. 2H after a subsequent processing step. The embodiment illustrated in FIG. 2I includes a dielectric 244 formed in opening 242. That is, dielectric 244 is formed in the area previously occupied by metal plug 236. Dielectric 244 can be formed, e.g., deposited, in a number of ways, including CVD and/or ALD, as will be appreciated by one of skill in the art.

Dielectric 244 can be, for example, an oxide dielectric, such as an $SiO_2$ dielectric, or a nitride dielectric, such as an $Si_3N_4$ dielectric. However, embodiments of the present disclosure are not limited to a particular type of dielectric.

The structures illustrated in FIGS. 1E, 2F, and 2I can be components, e.g., portions, of resistive memory cells. For example, the structures illustrated in FIGS. 1E, 2F, and 2I can be components of phase change random access memory (PCRAM) cells, e.g., the memory cells shown in FIG. 3.

Processing resistive memory, e.g., resistive memory cells or resistive memory devices, in accordance with embodiments of the present disclosure can increase the efficiency and decrease the cost of processing, e.g., manufacturing, resistive memory. For example, deposition techniques other than conformal deposition techniques, such as sputter deposition techniques, can be used to process resistive memory in which the heater electrode is self-aligned to the resistive memory cell material and spacer, as previously described herein. In contrast, previous approaches may use conformal deposition techniques to process resistive memory in which the heater electrode is self-aligned to the resistive memory cell material, which can decrease the efficiency and increase the cost of processing the resistive memory.

Additionally, processing resistive memory in accordance with embodiments of the present disclosure can decrease the size of resistive memory, and can also increase the speed of resistive memory, e.g., the rate at which resistive memory can program and/or sense data. Processing resistive memory in accordance with embodiments of the present disclosure can also increase the amount of data that can be stored by resistive memory. Further, processing resistive memory in accordance with embodiments of the present disclosure can increase the consistency and reliability of resistive memory. For example, processing resistive memory in accordance with embodiments of the present disclosure can decrease the number of erroneous data reads associated with resistive memory.

As one example, the resistive memory cell material can be formed on top of the bottom electrode in situ, and the heater electrode can be formed on top of the resistive memory cell material in situ, as previously described herein. Forming the resistive memory cell material and heater electrode in situ can prevent inconsistencies and voids from forming on the surfaces, e.g., edges, of the resistive memory cell material, e.g., the surfaces of the resistive memory cell material in contact with the bottom electrode and the heater electrode. In contrast, in previous approaches in which the resistive memory cell material is formed on top of the heater electrode, the resistive memory cell material may not be formed in situ, which can result in the formation of inconsistencies and voids on the surface of the resistive memory cell material in contact with the heater electrode.

As an additional example, processing resistive memory in accordance with embodiments of the present disclosure can allow the size of the resistive memory cell material to be based on the size of the bottom electrode and the heater electrode. That is, the resistive memory cell material can be sized according to the size of the bottom electrode and the heater electrode. Sizing the resistive memory cell material according to the size of the bottom and heater electrodes can result in a uniform distance between the surface, e.g., edge of the resistive memory cell material and the surfaces of the bottom and heater electrodes. In contrast, in previous approaches in which the heater electrode is formed before the resistive memory cell material is formed, the size of the resistive memory cell material may not be based on the size of the heater electrode, which can result in a non-uniform distance between the surface of the resistive memory cell material and the surface of the heater electrode.

Figure 3:
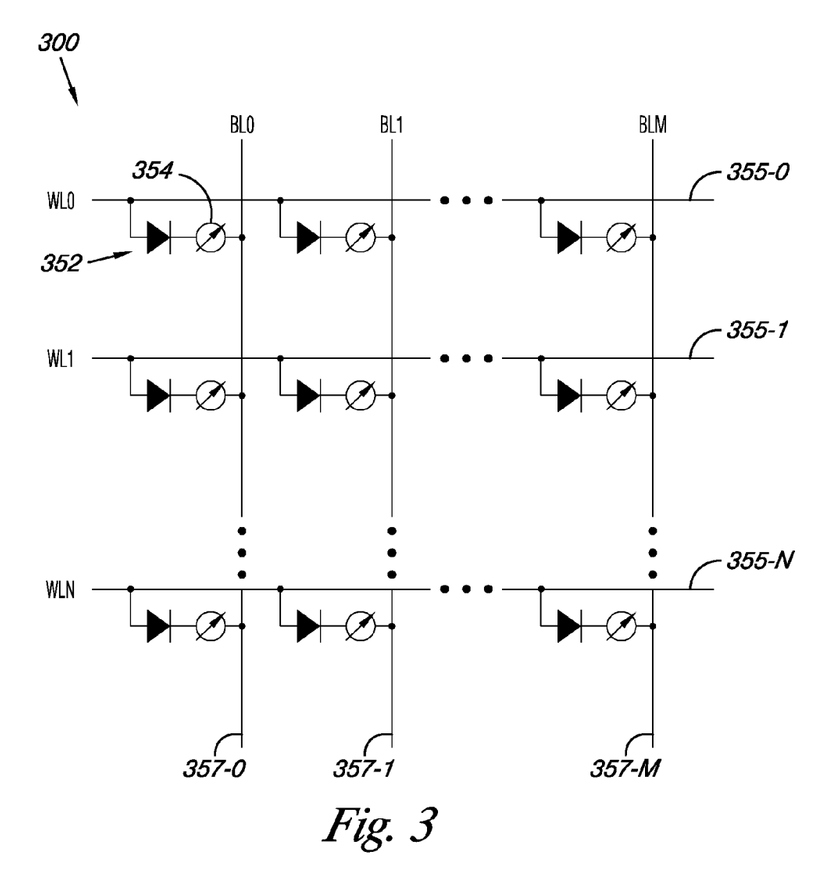
FIG. 3 is a schematic of a portion of a resistive memory array in accordance with embodiments of the present disclosure.

FIG. 3 is a schematic of a portion of a resistive memory array 300 in accordance with a number of embodiments of the present disclosure. Resistive memory array 300 includes a number of resistive memory cells each having an associated access device 352 and resistive memory structure 354. Resistive memory structures 354 can be structures processed in accordance with a number of embodiments of the present disclosure. For example, resistive memory structures 354 can be the structures illustrated in FIGS. 1E, 2F, and 2I.

Access devices 352 can be operated, e.g., e.g., turned on/off, to access the memory cells in order to perform operations such as programming, e.g., writing, and/or sensing, e.g., reading, operations on the memory cells. In the embodiment illustrated in FIG. 1, access devices 352 are diodes. Diodes can include, for example, p-n diodes, Zener diodes, and Schottky diodes. Alternatively, access devices 352 can be field effect transistors (FETs) or bipolar junction transistors (BJTs). Embodiments of the present disclosure are not limited to a particular type of access device.

As shown in FIG. 3, each access device 352 associated with each memory cell is coupled to one of a number of access lines, such as word lines 355-0 (WL0), 355-1 (WL1), . . . , 355-N (WLN), e.g., each word line 355-0, 355-1, . . . , 355-N is coupled to a "row" of resistive memory cells. The designator "N" is used to indicate that a memory array can include a number of word lines. The use of the term "row" is not meant to imply a particular linear and/or horizontal orientation of the memory cells. Rather, a row can mean a number of memory cells coupled to a particular word, line, regardless of the orientation of the memory cells. For example, a row can include a number of memory cells coupled to a particular word line in a staggered, non-linear orientation.

As shown in FIG. 3, each resistive memory structure 354 is coupled to one of a number of data lines, such as bit lines 357-0 (BL0), 357-1 (BL1), . . . , 357-M (BLM), e.g., each bit line 357-0, 357-1, . . . , 357-M is coupled to a "column" of resistive memory cells. The designator "M" is used to indicate that a memory array can include a number of bit lines. For ease of addressing in the digital environment, the number of word lines 355-1, . . . , 355-N and the number of bit lines 357-1, . . . , 357-M can each be some power of two, e.g., 256 word lines by 4,096 bit lines. However, embodiments are not limited to particular numbers of word lines and/or bit lines. Further, the use of the term "column" is not meant to imply a particular linear and/or vertical orientation of the memory cells. Rather, a column can mean a number of memory cells coupled to a particular bit line, regardless of the orientation of the memory cells. For example, a column can include a number of memory cells coupled to a particular bit line in a staggered, e.g., non-linear, fashion.

In operation, appropriate voltage and/or current signals, e.g., pulses, can be applied to bit lines 357-0, 357-1, . . . , 357-M and/or word lines 355-0, 355-1, . . . , 355-N in order to program data to and/or sense data from the resistive memory cells of resistive memory array 300. For example, during a programming operation, a current, e.g., a programming current, can be used to heat a heater electrode associated with resistive memory structures 354 to program the resistive memory cells, as previously described herein.

The memory cells shown in resistive memory array 300 can be single level cells (SLCs) and/or multilevel cells (MLCs), e.g., single level PCRAM cells and/or multilevel PCRAM cells. A single level PCRAM cell can be programmed to a generally more amorphous (reset) state or a generally more crystalline (set) state. Such reset and/or set states can correspond to a binary 0 and/or 1. A reset pulse can include a relatively high current pulse applied to the PCRAM cell, e.g., to the heater electrode of the PCRAM cell, for a relatively short period of time. The current applied to the PCRAM cell can be quickly reduced after the PCRAM cell material of the PCRAM cell "melts," allowing the PCRAM cell material to cool quickly into a more amorphous state where atomic motion that can allow crystallization generally occurs to a lesser degree due, at least in part, due to relatively rapid cooling of the PCRAM cell material. Conversely, a set pulse can include a relatively lower current pulse applied to the cell for a relatively longer period of time with a slower quenching speed, e.g., the current can be more slowly reduced allowing the PCRAM cell material greater time to cool. Accordingly, the PCRAM cell material can crystallize to a greater degree than after the reset pulse. Some PCRAM cell materials can have a greater resistivity associated with a more amorphous state and a lesser resistivity associated with a more crystalline state.

Multilevel PCRAM cells can be programmed to a number of intermediate states between amorphous and crystalline. For example, multilevel PCRAM cells can be programmed to various levels of structural order. Through application of a number of programming pulses at particular current levels, the PCRAM cells can be programmed to a given resistance state. With appropriate programming currents, the PCRAM cells can be programmed to a number of intermediate states having a partial amorphous and a partial crystalline structure, providing for multilevel resistance states. The number of data states chosen for a particular PCRAM cell can be based on, for example, the desired application, design and process limits, e.g., programming time, sensing time, and accuracy of sensing circuitry, and other factors.

In a number of embodiments, resistive memory array 300 can include resistive memory cells stacked in a three-dimensional configuration. That is, resistive memory array 300 can include a first number of resistive memory cells, and a second number of resistive memory cells stacked on top of the first number of resistive memory cells.

For example, resistive memory array 300 can include an additional row of resistive memory cells stacked on top of the row of resistive memory cells coupled to word line 355-0, an additional row of resistive memory cells stacked on top of the row of resistive memory cells coupled to word line 355-1, etc. Resistive memory array 300 can also include an additional column of resistive memory cells stacked on top of the column of resistive memory cells coupled to bit line 357-0, an additional column of resistive memory cells stacked on top of the column of resistive memory cells coupled to bit line 357-1, etc.

In a number of embodiments, each column of resistive memory cells in a particular column stack can be coupled to a common, e.g., the same, bit line. For example, an additional column of resistive memory cells stacked on top of the column of resistive memory cells coupled to bit line 357-0 can also be coupled to bit line 357-0, an additional column of resistive memory cells stacked on top of the column of resistive memory cells coupled to bit line 357-1 can also be coupled to bit line 357-1, etc.

Embodiments of the present disclosure are not limited to resistive memory array 300 illustrated in FIG. 3. For example, a memory array can have an architecture other than that illustrated in FIG. 3, as will be understood by one of ordinary skill in the art. Further, as one of ordinary skill in the art will appreciate, resistive memory array 300 can be coupled to a controller, e.g., control circuitry, and/or programming and sensing circuitry (not shown in FIG. 3).

CONCLUSION

Resistive memory and methods of processing resistive memory are described herein. One or more method embodiments of processing resistive memory include forming a resistive memory cell material on an electrode having an access device contact, and forming a heater electrode on the resistive memory cell material after forming the resistive memory cell material on the electrode such that the heater electrode is self-aligned to the resistive memory cell material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of processing a resistive memory cell, comprising:
   forming a resistive memory cell material on an electrode having an access device contact; and
   forming a heater electrode on a top surface of the resistive memory cell material after forming the resistive memory cell material on the electrode such that the heater electrode is self-aligned to the resistive memory cell material;
   removing a portion of the heater electrode; and
   removing only a portion of the top surface of the resistive memory cell material.

2. The method of claim 1, wherein the method includes forming the resistive memory cell material on the electrode and the heater electrode on the resistive memory cell material in situ.

3. The method of claim 1, wherein the method includes removing the portion of the heater electrode such that an area of the heater electrode in contact with the resistive memory cell material is smaller than an area of the electrode in contact with the resistive memory cell material.

4. A method of processing a memory cell, comprising:
   forming a cell material on an electrode having an access device contact in situ;

forming a heater electrode on a top surface of the cell material in situ after forming the cell material on the electrode;

removing a portion of the heater electrode and only a portion of the top surface of the resistive cell material; and forming a first spacer on the cell material and adjacent a sidewall of the heater electrode such that the first spacer occupies a portion of an area previously occupied by the removed portion of the heater electrode and the removed portion of the cell material.

5. The method of claim 4, wherein the method includes removing an additional portion of the cell material.

6. The method of claim 5, wherein the method includes forming a second spacer on the cell material and adjacent a sidewall of the first spacer such that the second spacer occupies a portion of an area previously occupied by the removed additional portion of the cell material, wherein the second spacer is a different material than the first spacer.

7. The method of claim 4, wherein the cell material is a phase change material.

8. The method of claim 4, wherein the method includes forming a dielectric plug on the heater electrode.

9. The method of claim 4, wherein the method includes: forming a metal plug on the heater electrode; removing the metal plug after the first spacer is formed; and forming a dielectric in an area previously occupied by the removed metal plug.

10. The method of claim 4, wherein the method includes forming the cell material and the heater electrode using a sputter deposition technique.

* * * * *

UNITED STATES PATENT AND TRADEMARK OFFICE
CERTIFICATE OF CORRECTION

| | |
|---|---|
| PATENT NO. | : 8,283,198 B2 |
| APPLICATION NO. | : 12/776764 |
| DATED | : October 9, 2012 |
| INVENTOR(S) | : David H. Wells |

It is certified that error appears in the above-identified patent and that said Letters Patent is hereby corrected as shown below:

In column 12, line 63, in Claim 3, delete "ceil" and insert -- cell --, therefor.

Signed and Sealed this
Eighteenth Day of December, 2012

David J. Kappos
*Director of the United States Patent and Trademark Office*